US012682144B2

(12) United States Patent
Kiffe et al.

(10) Patent No.: US 12,682,144 B2
(45) Date of Patent: Jul. 14, 2026

(54) COMPUTER-IMPLEMENTED METHOD FOR SIMULATING AN ELECTRICAL CIRCUIT

(71) Applicant: DSPACE DIGITAL SIGNAL PROCESSING AND CONTROL ENGINEERING GMBH, Paderborn (DE)

(72) Inventors: Axel Kiffe, Paderborn (DE); Katrin Witting, Paderborn (DE)

(73) Assignee: dSPACE GMBH, Paderborn (DE)

( * ) Notice: Subject to any disclaimer, the term of this patent is extended or adjusted under 35 U.S.C. 154(b) by 1234 days.

(21) Appl. No.: 17/241,821

(22) Filed: Apr. 27, 2021

(65) Prior Publication Data

US 2021/0264084 A1     Aug. 26, 2021

Related U.S. Application Data

(63) Continuation of application No. PCT/EP2019/081535, filed on Nov. 15, 2019.

(30) Foreign Application Priority Data

Nov. 15, 2018     (DE) ..................... 10 2018 128 653.8

(51) Int. Cl.
    *G06F 30/3308*     (2020.01)
    *G06F 30/337*     (2020.01)

(52) U.S. Cl.
    CPC ........ *G06F 30/3308* (2020.01); *G06F 30/337* (2020.01)

(58) Field of Classification Search
    CPC .... G06F 30/3308; G06F 30/337; G06F 30/33; G06F 30/367
    See application file for complete search history.

(56) References Cited

U.S. PATENT DOCUMENTS

| | | | |
|---|---|---|---|
| 9,665,672 B2 | 5/2017 | Dufour | |
| 2018/0365361 A1* | 12/2018 | Kiffe | ...................... G05B 17/02 |

FOREIGN PATENT DOCUMENTS

| | | |
|---|---|---|
| CN | 106649927 A | 5/2017 |
| EP | 3418924 A1 | 12/2018 |
| JP | 2002-183990 A | 6/2002 |
| JP | 2013114512 A | 6/2013 |
| JP | 2014178751 A | 9/2014 |

OTHER PUBLICATIONS

Jose M. Burdio and Abelardo Martinez, "A Unified Discrete-Time State-Space Model for Switching Converters," IEEE Transactions on Power Electronics, vol. 10, No. 6, Nov. 1995 (Year: 1995).*

(Continued)

*Primary Examiner* — Steven W Crabb
(74) *Attorney, Agent, or Firm* — Muncy, Geissler, Olds & Lowe, P.C.

(57) ABSTRACT

A computer-implemented method for simulating an electrical circuit via at least one computing unit, the electrical circuit comprising circuit components with switch elements, wherein the switch elements are capable of assuming either a conductive or a blocking switched state, wherein the circuit is described by a mathematical representation MR and the circuit for each total switched state is calculated on the computing unit by numerically solving the mathematical representation MR describing the total switched state.

19 Claims, 5 Drawing Sheets

(56) References Cited

OTHER PUBLICATIONS

Andrea Benigni and Antonello Monti, "A parallel approach to real-time simulation of power electronics systems." IEEE Transactions on Power Electronics 30, No. 9 5192-5206 (2015) (Year: 2015).*
Deepa Ramaswamy and Ryan McGee, "A Case Study in Hardware-In-the-Loop Testing: Development of an ECU for a Hybrid Electric Vehicle," SAE Technical Paper Series 2004-01-0303 12 pages (2004) (Year: 2004).*
International Search Report dated Feb. 19, 2020 in corresponding application PCT/EP2019/081535.
V. Rajagopalan: "Computer-Aided Analysis of Power Electronic Systems" Industrial Electronics Society, 1988, IECON '88, pp. 528-533, DOI: 10.1109/IECON.1988.665738, XP032286496.
Ali Bekir Yildiz: "Determination of unified time constants of switching circuits in terms of averaged-nodal equations" Automatika—Journal for Control, Measurement, Electronics, Computing and Communications, vol. 58, No. 1, 2017, pp. 11-17, DOI: 10.1080/00051144.2017.1305600, ISSN: 0005-1144, XP055667876.
Jörg Wollnack: "Regelungstechnik II—Zustandsregelungen, digitale und nichtlineare Regelsysteme" 2001, pp. 1-151, retrieved from the Internet: https://www.tuhh.de/ft2/wo/Scripts/ScriptRegelungstechnikII. pdf , XP055667829.
Handy Fortin Blanchette et al: "A State-Space Modeling Approach for the FPGA-Based Real-Time Simutlation of High Switching Frequency Power Converters" IEEE Transactions on Industrial Electronics, vol. 59, No. 12, 2011, pp. 4555-4567.
Predrag Pejović et al: "A Method for Fast Time-Domain Simulation of Networks with Switches" IEEE Transactions on Power Electronics, vol. 9, No. 4, 1994, pp. 449-456.
S.Y.R. Hui et al: "Generalised associated discrete circuit model for switching devices" IEE Proc.-Sci. Meas. Technol., vol. 141, No. 1,1994, pp. 57-64.
Mahmoud Matar et al: "FPGA Implementation of the Power Electronic Converter Model for Real-Time Simulation of Electromagnetic Transients" IEEE Transactions on Power Delivery, vol. 25, No. 2, first published 2009, pp. 852-860.
Roger Champagne et al: "Analysis and Validation of a Real-Time AC Drive Simulator" IEEE Transactions on Power Electronics, vol. 19, No. 2, 2004, pp. 336-345.
De Kelper et al., "Switching Time Model Updating for the Real-Time Simulation of Power-Electronic Circuits and Motor Drives", IEE Transactions on Energy Conversion, IEEE Service Center, Mar. 1, 2005, pp. 181-186.
Office Action for European Application No. 19805278.9 mailed on Feb. 5, 2025.

* cited by examiner

COMPUTER-IMPLEMENTED METHOD FOR SIMULATING AN ELECTRICAL CIRCUIT

This nonprovisional application is a continuation of International Application No. PCT/2019/081535, which was filed on Nov. 15, 2019, and which claims priority to German Patent Application No. 10 2018 128 653.8, which was filed in Germany on Nov. 15, 2018, and which are both herein incorporated by reference.

BACKGROUND OF THE INVENTION

Field of the Invention

The present invention relates to a computer-implemented method for simulating an electrical circuit via at least one computing unit, wherein the electrical circuit comprises circuit components having switch elements, the switch elements being capable of assuming either a conductive or a blocking switched state, the circuit being described by a mathematical representation and the circuit for each total switched state being calculated on the computing unit by numerically solving the mathematical representation describing the total switched state.

Description of the Background Art

The invention is related to the technical field of real-time simulation of electrical circuits for the purpose of influencing or testing a technical-physical process. The technical-physical process can be a control device, for example, such as the ones used in large numbers in automobiles, aircraft, energy generation and energy distribution systems, etc. The technical-physical process can also be, for example, the frequency converter of an electric drive, a DC/DC converter, a power supply network, any controlled machine parts—in particular from automation technology—that are controlled by the simulated electrical circuit. The first use case concerns the area of hardware-in-the-loop simulation (HIL); the second use case is often referred to as Rapid Control Prototyping (RCP).

The above-mentioned computing unit, via which the simulation is performed, is therefore often a component of an HIL simulator or a real-time RCP computer, usually intended to replace a control unit; both systems have an I/O interface. Electrical signals can be read in or output via the I/O interface, wherein the electrical signals can be analog or digital communications signals with low power. In the case of electrical loads or power amplifiers, however, considerable electrical power can also be transmitted via the I/O interface, for example for the control of electric motors.

Thus, the I/O interface is used to output selected calculated output variables of the overall electrical circuit as electrical signals so that they act on the technical-physical process. Additionally or alternatively, process variables of the technical-physical process are recorded using measurement technology and are read in as electrical signals via the I/O interface and made available to the computing unit. The simulation has a direct influence on the physical world.

In the case of power electronic applications involving, for example, electrical drives, electrical generators or electrical power supply networks, the overall electrical circuit typically also has, in addition to ohmic resistances, capacitors and coils, a large number of (semiconductor) switches, for example in power output stages for the implementation of a converter. In the overall circuit, for example, converter control data can then be generated which serve for the suitable control of the power switches of the converter, wherein these are usually implemented as semiconductor switch elements (e.g. MOSFET, metal-oxide-semiconductor field-effect transistor). These circuit breakers/power switches can be actively switched through or blocked by a control connection. Other switch elements in power electronic circuits are diodes, which are used, for example, anti-parallel to circuit breakers in bridge circuits and via which currents driven by inductance can be reduced when the circuit breakers are off. These free-wheeling diodes—like other diodes, of course—cannot be actively switched through or blocked via a control connection; rather, their conductive state results from their electrical connection size, i.e. from their terminal voltage or the internal diode current.

The simulation of such circuits, in particular power electronic circuits, places high demands on the simulation hardware used, i.e. on the computing units used and their memory equipment, in particular because the simulation must usually take place in real time, since a real process is acted upon or variables obtained by measurement from a real process are processed within the scope of the simulation. It is therefore important to regularly check whether the requirements in terms of computing time and memory are met.

The computing units can be different cores of a processor, but they can also be different processors of a multiprocessor system, which is not infrequently the case with larger HIL simulators. It is also possible that one computing unit or a plurality of computing units is or are implemented based on one (or more) FPGA (field programmable gate array), which results in speed advantages but also difficulties with regard to certain numerical operations such as division.

It is known in the conventional art to describe the circuits described herein using mathematical representations on the basis of physical laws. By setting up mesh and node equations, such circuits can be represented mathematically, for example, in nodal form with an impedance matrix M or by defining input and output variables as well as state variables in the state space with the matrices A, B, C, D. In both types of mathematical representation, extensive systems of equations result. The particular difficulty with electrical circuits including switch elements consists in that these switch elements cannot be represented as terms of an equation as such, but a change in the switched state of a switch element always leads to a change in the structure of the circuit under consideration and thus also to a modified mathematical representation. If a circuit contains, for example, n switch elements, then $2^n$ total switched states of the circuit result, wherein each of the total switched states corresponds to a separate mathematical representation of the circuit. A complete description of the electrical circuit taking into account all total/complete switched states, i.e. the state of the whole circuit, consequently leads to $2^n$ different mathematical sub-representations of the circuit. It can easily be recognized that this procedure is very expensive.

It is known in the conventional art, for example, to reduce the effort required to describe the circuit in a mathematical representation, taking into account all possible total switched states, by a suitable disconnection of the electrical circuit for which reference is made to EP 3418924 A1.

SUMMARY OF THE INVENTION

It is therefore an object of the present invention to provide a method for simulating an electrical circuit described above in such a way that it is possible in the simplest possible way of modeling the circuit in a mathematical representation with a plurality—at best with all —combinations of the switched states of the switch elements and thus with a plurality—ideally with all—total switched states, and to calculate them numerically.

In the initially mentioned method for simulation of an electric circuit, the previously derived object is achieved firstly and substantially in that a conductive switch element in the circuit is represented by a switch coil, and that a blocking switch element in the circuit is represented by a switch capacitor. Further, the electrical behavior of switch coil and switch capacitor is described by structurally identical time-discrete switch equations $i_{S,k}$, so that by using the structurally identical time-discrete switch equations $i_{S,k}$ for the switch elements, a switched state-independent, time-discrete state space representation H, $\phi$, $C_d$, $D_d$ for all total switched states of the circuit results as a mathematical representation, and the simulation is performed on the computing unit on the basis of the switched state-independent, time-discrete state space representation H, $\phi$, $C_d$, $D_d$ for all total switched states of the circuit.

By replacing a switch element with a capacitor—here called a switch capacitor—in the case of blocking and by a coil—here called a switch coil—in the conductive case, the first thing that is achieved is that the switch elements are reflected in the mathematical representation—whatever the type—and thus become tangible in the mathematical representation. This is an important difference from the conventional art described above, in which the switch elements do not appear at all in the mathematical representation, but instead only the selection of the switch position of the respective switch element—conductive or blocking—leads to a modified mathematical representation of the electrical circuit. The idea now is to mathematically describe the switch coil and the switch capacitor by structurally identical switch equations, that is, switch equations that are mathematically identical, regardless of whether they describe a switch coil or a switch capacitor. This is possible if the equations for switch coil and switch capacitor are formulated in the time-discrete range; in this respect we are talking about structurally identical, time-discrete switch equations $i_{s,k}$, wherein k denotes the k-th calculation step. How these time-discrete switch equations $i_{s,k}$ actually look is explained in detail in the description of the figures.

Provided that the identical description of switch coil and switch capacitor are in the time-discrete range, it is then possible, by using the structurally identical time-discrete circuit equations $i_{S,k}$ for the switch elements, to set up a time-discrete state space representation with the matrices H, $\phi$, $C_d$, $D_d$, which is independent of the switched state and which describes all total switched states of the circuit in a single mathematical representation. This has the advantage that the simulation of the electrical circuit can then be carried out on the computing unit on the basis of the switched state-independent, time-discrete state space representation H, $\phi$, $C_d$, $D_d$ for all total switched states of the circuit. It is no longer necessary to switch between many different mathematical representations—a separate mathematical representation for each total switched state—leading to a considerable simplification of the simulation, in particular to a considerable amount of memory saved.

The structurally identical, time-discrete switch equations $i_{S,k}$ for the switch elements can have a uniform conductance component $G_S$ for the conductive and the blocking switched states of the respective switch element. In this exemplary embodiment, it is a central boundary condition for the time-discrete switch equations in order to become structurally identical. Furthermore, the structurally identical, time-discrete switch equations $i_{S,k}$ also have a power source component $I_{S,k}$. The power source components $I_{S,k}$ (a separate power source component $I_{S,k}$ is required for each switch element) are then provided as additional inputs in the time-discrete state space description H, $\phi$, $C_d$, $D_d$, which is why the time-discrete state space representation H, $\phi$, $C_d$, $D_d$ can then be described as independent of the switched state, because different total switched states can only be set by influencing the additional inputs on which the power source components $I_{S,k}$ act.

In order to shorten transient transitions when changing the switched state of a switch element (or also several switch elements), the corresponding power source component $I_{S,k}$ can have an additional pulse current $\tilde{I}_{FF}$, thus implementing a feed-forward control. The pulse current $\tilde{I}_{FF}$ is preferably not equal to zero in only one calculation step; most preferably it only acts at the time of switchover of the respective switch element, which in the time-discrete world is the concept of a "pulse-shaped" signal. Virtually any shortening of the transient switching processes is advantageous, but it is particularly beneficial if the level of the pulse current $\tilde{I}_{FF}$ is calculated for a switch element, with the proviso that the transient transition is completely avoided when switching the switched state of the switch element.

The calculation of the level of the pulse current $\tilde{I}_{FF}$ is of course associated with some effort. Therefore, in a further development of the method only the power source components $I_{S,k}$ of those switch elements that are rated as "important", for example that have the highest actual or expected switching frequency, are equipped with the additional pulse current $\tilde{I}_{FF}$.

A further development of the method described herein is focused on answering the question of how the uniform conductance components $G_S$ should be specifically selected for the switch elements in the structurally identical, time-discrete switch equations $i_{S,k}$. It is immediately evident that an open switch element is simulated best by a switch capacitor with the smallest possible capacitance, since a switch capacitor with the smallest possible capacitance very quickly assumes its final stationary state with regard to current and voltage. In the same way, a closed switch element is best simulated by a switch coil with the smallest possible inductance, since here too the final stationary state with regard to current is reached via the switch coil and voltage at the switch coil. The uniform description of switch coil current and switch capacitor current indicates, however, that the required uniform conductance component $G_S$, at a small capacitance of the switch capacitor, can only be realized by a large value of the inductance of the switch coil and vice versa, which corresponds with contrasting design goals. Thus, there is the question of advantageously choosing the uniform conductance component $G_S$. It should be noted that an individual uniform conductance component $G_S$ can be selected for each switch element, and equally, identical values for the uniform conductance component $G_S$ can be assumed for all switch elements of the circuit. The optimization process described here can be applied to both approaches.

An advantageous choice of the uniform conductance component $G_S$ is made systematically in that a specific extended time-discrete state space representation with a system matrix $\phi^*$ is obtained from the switched state-independent time-discrete state space representation H, $\phi$, $C_d$, $D_d$ by using the specific choice for the conductance components $G_S$ and the power source components $I_{S,k}$ and possibly the pulse currents $\tilde{I}_{FF}$, and that the eigenvalues $\lambda_i$ are calculated as stability parameters of the system matrix φ*. The eigenvalues make a decisive statement about the dynamic behavior of the time-discrete overall system, i.e. the time-discrete modeled electrical circuit, and are thus meaningful also as absolute values.

It is provided that as a reference circuit for each total switched state of the electrical circuit, a switched state-dependent time-discrete state space representation is calculated by assuming the smallest possible values for the inductances of the switch coils and for the capacitances of the switch capacitors. When working with the conductance components, this is only possible with the proviso that for the switch elements, a uniform conductance component $G_S$ must be used for the conductive and the blocking switched states of the respective switch elements. For each individual total switched state of the circuit, a system matrix of the switched state-dependent, time-discrete state space representation of the reference circuit can then be determined and from this, the reference eigenvalues $\lambda_{Refi}$ can be calculated. The reference eigenvalues then practically represent the desired eigenvalue configuration, as they are based on the optimal configuration of both the switch capacitor and the switch coil. By calculating a quality criterion using the eigenvalues $\lambda_i$ of the system matrix of the expanded time-discrete state space representation and the reference eigenvalues $\lambda_{Refi}$ of the system matrix of the switched state-dependent time-discrete state space representation, the best choice for the uniform conductance component $G_S$ is then determined for the conductive and the blocking switched states of the respective switch element.

To determine the best choice for the uniform conductance component $G_S$, a summary measure for a dynamic variance can be calculated as the quality criterion J, namely from the sum of the differences between the eigenvalues A of the system matrix of the extended time-discrete state space representation and the corresponding reference eigenvalues $\lambda_{Refi}$ of the system matrix of the switched state-dependent time-discrete state space representation of the respective reference circuit. Finally, the uniform conductance components $G_S$ for which the summary measure of the dynamic variance is minimized are selected as optimal. Preferably, the various switched states of the switched state-dependent time-discrete state space representation of the overall reference circuit are also summed up.

The invention also relates to a simulator with a computing unit for simulating an electrical circuit, wherein the computing unit is programmed with a program in such a way that it performs the method described above when executing the program.

The invention also relates to a computer program, comprising commands which, when the program is executed via a computing unit, cause the latter to carry out the method described above.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

FIGS. 1 to 5 show a computer-implemented method 1 with different priorities for simulating an electric circuit 2 with circuit components R, L, T.

Figure 1:
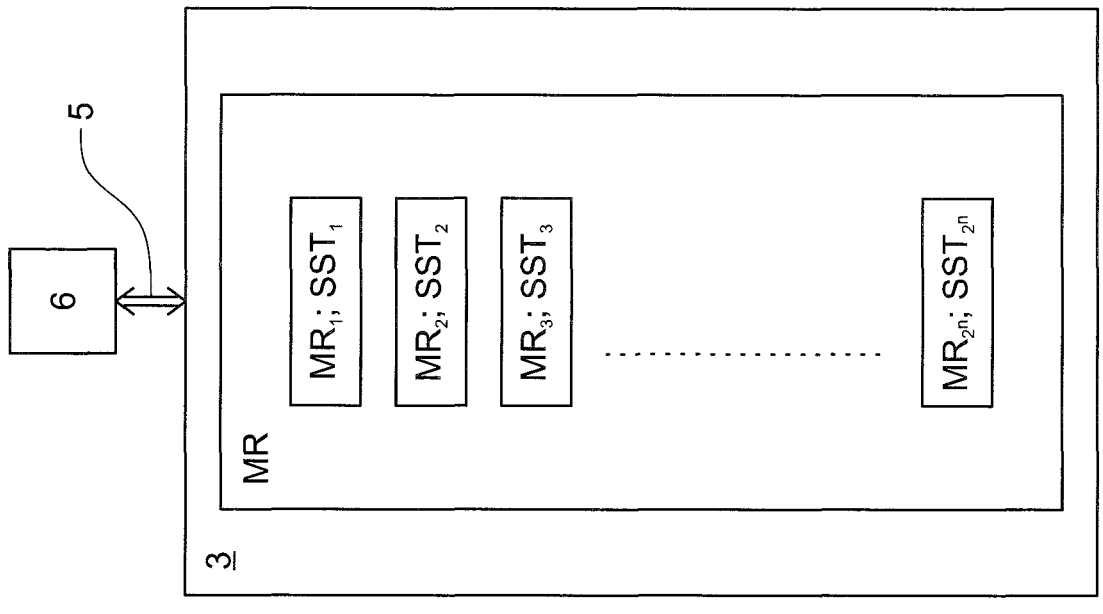
FIG. 1 shows an electrical circuit with switch elements and the handling of the switch elements according to the conventional art in order to obtain a mathematical representation and to calculate this on a computing unit.
Figure 1:
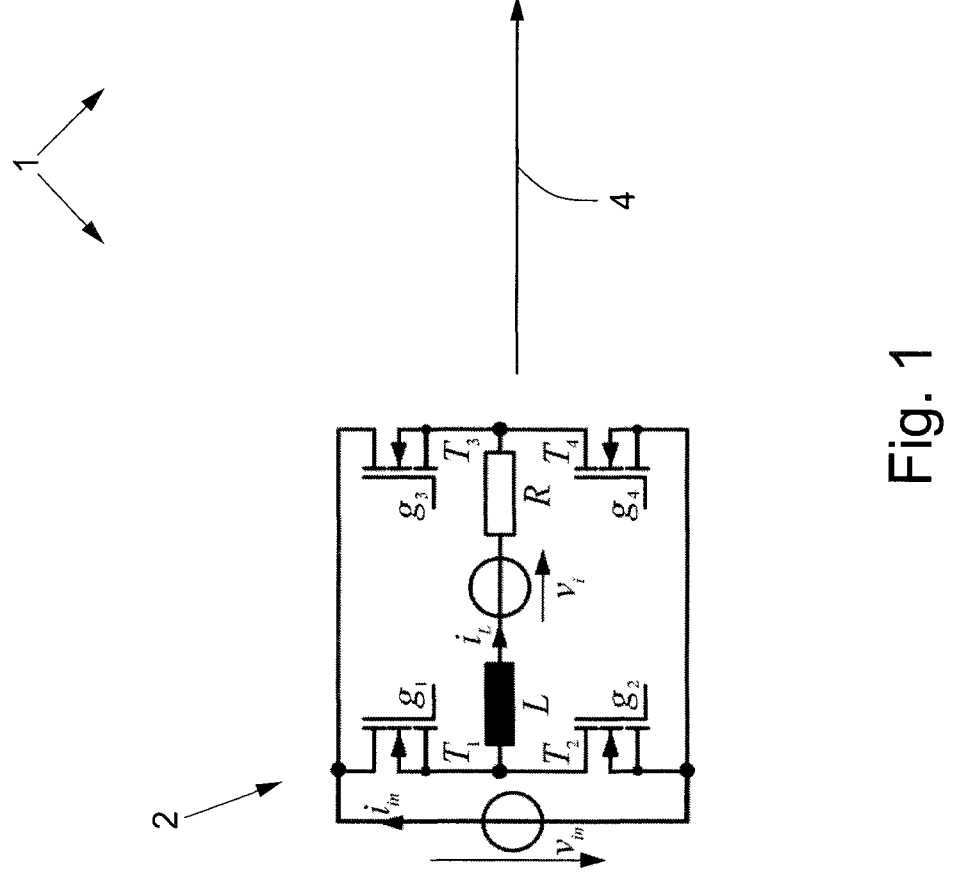

FIG. 1 shows such a computer-implemented method 1 for simulating an electrical circuit 2 via at least one computing unit 3, as is known from the conventional art. The circuit 2 in FIG. 1 is a simple single-phase full bridge inverter. The electric circuit 2 includes various circuit components R, L, T, for example, a coil L, an ohmic resistor R and MOSFET transistors $T_1$, $T_2$, $T_3$, $T_4$ with control terminals $g_1$, $g_2$, $g_3$, $g_4$. Here, the MOSFET transistors $T_1$, $T_2$, $T_3$, $T_4$ represent the switch elements $T_i$. These switch elements $T_i$ can either assume a conductive or a blocking switched state.

Subsequently, the electrical circuit 2 is described 4 by a mathematical representation MR. Depending on the individual switched state of the respective switch element $T_i$, different total switched states $SST_i$ occur in the circuit 2. By numerically solving the mathematical representation $MR_i$ describing the respective total switched state $SST_i$, the electric behavior of the circuit 2 is calculated. As has already been explained in the general description, with n switch elements $T_i$, there are $2^n$ different switched states of the circuit 2. For the usual mathematical representations MR of the circuit 2, this means that each different switching combination of the switch elements $T_i$ leads to an individual total switched state $SST_i$. The sum of all mathematical representations $MR_i$ for each total switched state $SST_i$ then forms the comprehensive mathematical representation MR for circuit 2.

Depending on the switched state of the switch element $T_i$ (which can also be a diode, a mechanical switch, another semiconductor switch element, etc.), the correspondingly applicable mathematical representation $MR_i$ is used to calculate the respective total switched state $SST_i$ on the computing unit 3.

FIG. 1 also indicates that the computing unit 3, which here can be part of an HIL simulator, is connected to a physical process 6 via an I/O interface 5 and acts on the physical process 6 by outputting corresponding variables calculated in the context of the simulation, and, by measuring corresponding variables from the physical process 6, also receives data that is then incorporated in the simulation of the electrical circuit 2.

Thus, the computing unit 3 is in direct interaction with the real world and the calculation of the electrical circuit 2 on the calculating unit 3 leads to direct interaction with the physical process 6. It is readily apparent that the procedure shown in FIG. 1 is extremely memory-intensive and is also complex to handle, since a corresponding mathematical sub-representation MR$_i$ of the circuit 2 must be used for each individual combination of the switched states of the switch elements T$_i$. The switch elements T$_i$ are not elements of the respective mathematical representation MR$_i$, but rather lead to a structural change in the circuit 2, which is taken into account by various mathematical representations MR in the respective total switched state SST$_i$.

If, for example, the state space is used as the mathematical representation MR$_i$ for each total switched state SST$_i$, a multitude of state space representations results, namely exactly as many as total switched states SST$_i$ exist. For the sake of simplicity, the specific total switched state is marked with the letter $\xi$ in the following equation. Thus, the continuous-time state space representation has the following general form for each switched state SST$_i$ or $\xi$:

$$\dot{x}=A^{(\xi)}x+B^{(\xi)}u, y=C^{(\xi)}x+D^{(\xi)}u$$

The letters used in the above equation are written in bold to indicate that these are matrices or vectors. The matrices A, B, C and D are system, input, output and transmission matrix. The state vector x usually contains all state variables of the energy store, for example voltages at capacitors and currents in coils, the output vector y contains all the resulting output variables and the input vector u usually contains the values of all current and voltage sources.

As has already been explained, at all times during the simulation of circuit 2 with the computing unit 3 it should be checked as to which switch elements T$_i$ are conductive or blocking. Accordingly, during the calculation, it must always be monitored as to which switch elements T$_i$ are in which switched state SST$_i$ or $\xi$. Consequently, in the subsequent calculation, the continuous-time state space representation valid for the total switched states SST$_i$ or $\xi$ should be selected. With n switch elements T$_i$ there are therefore $2^n$ different state space representations. This solution is memory-intensive and poses a problem, in particular when computing units 3 are implemented on an FPGA (field programmable gate array) basis.

Figure 2:
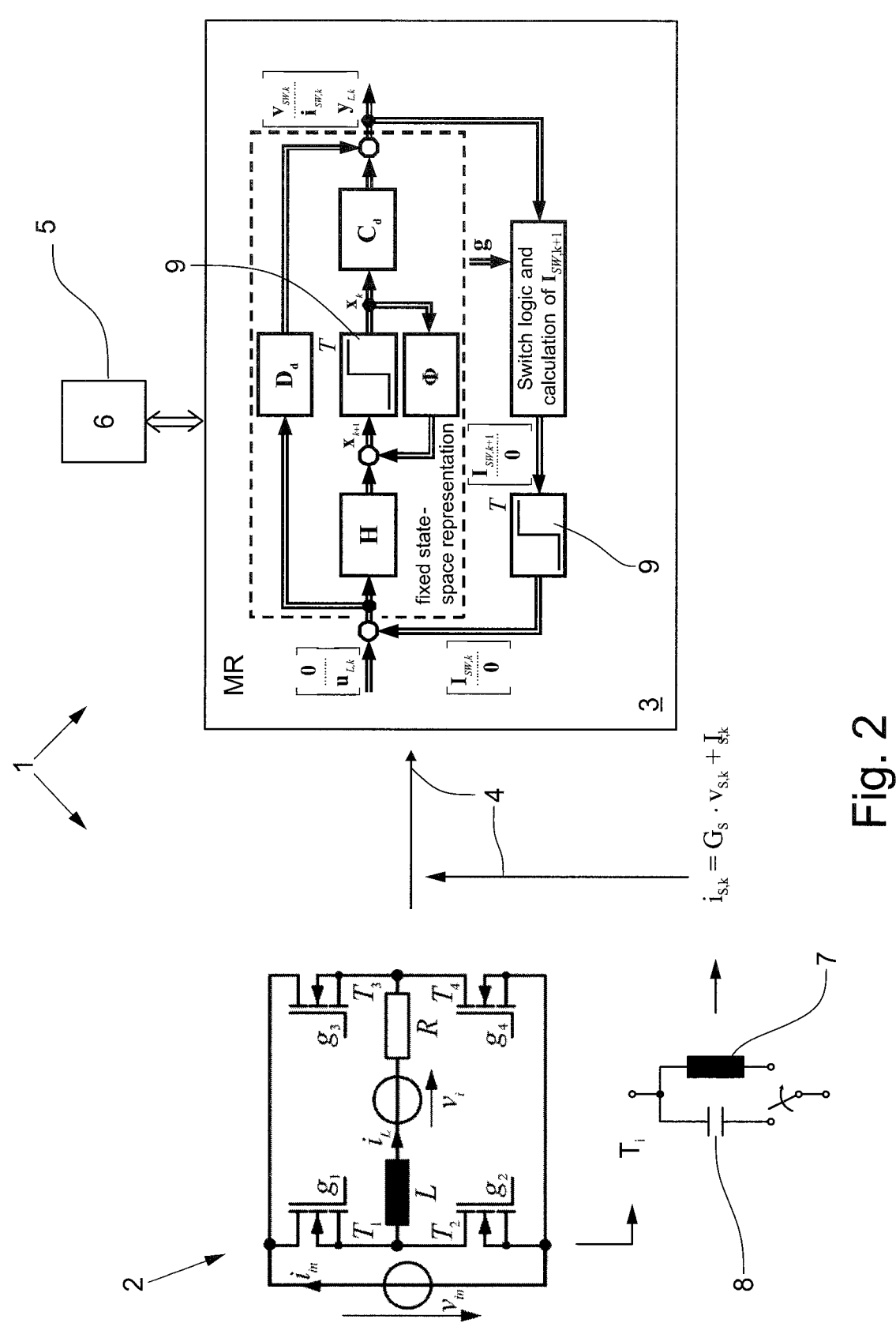
FIG. 2 shows an electrical circuit with switch elements and the inventive handling of the switch elements in order to obtain a mathematical representation and to calculate this on a computing unit.

FIG. 2 now schematically shows how the method 1 for simulating the electrical circuit 2 can be simplified to a considerable extent. FIG. 2 shows both the basic principle as well as special designs which are also described in detail below. The method 1 used here is characterized in that a conductive switch element T$_i$ in the circuit 2 is represented by a switch coil 7 and that a blocking of the switch element T$_i$ in the circuit 2 is represented by a switch capacitor 8. With this measure alone there would still be the problem that it would be necessary to switch back and forth between two different elements, namely the switch coil 7 and the switch capacitor 8, whereby the structural variance of the mathematical description MR could not be eliminated. An essential further feature is therefore that the electrical behavior of switch coil 7 and switch capacitor 8 for each switch element T$_i$ is described by structurally identical, time-discrete switch equations i$_{S,k}$.

Using the structurally identical time-discrete switch equations i$_{S,k}$ for the switch elements T$_i$ then results in a switched state-independent, time-discrete state space representation H, $\phi$, C$_d$, D$_d$ for all total switched states SST$_i$ of the circuit 2. How exactly this can happen is further explained below as an example. The simulation can then be performed on the computing unit 3 on the basis of the switched state-independent, time-discrete state space representation H, $\phi$, C$_d$, D$_d$ for all total switched states SST$_i$ of the circuit 2. Via the measures of the equivalent circuit for a switch element T$_i$ with the use of switch coil 7 and switch capacitor 8 as well as the time-discrete description of the electrical behavior of switch coil 7 and switch capacitor 8, it is possible to generate structurally identical, time-discrete switch equations i$_{S,k}$ for the switch elements T$_i$, which are then incorporated in a switched state-independent, time-discrete state space representation H, $\phi$, C$_d$, D$_d$. The result is a single, closed representation MR of the electric circuit 2, and there is no longer a need for different mathematical representations MR for each total switched state SST$_i$. This simplifies the method 1 for simulating the electrical circuit 2, and the computing unit 3 resources required for such a simulation are reduced quite considerably as compared to the method known from the conventional art.

The following now shows how it is possible to describe the electrical behavior of switch coil 7 and switch capacitor 8 via structurally identical, time-discrete switch equations i$_{S,k}$. The following relationship in the form of equation 1 is used for temporal discretization:

$$x_{k+1}=x_k+T\cdot(\gamma\cdot\dot{x}_{k+1}+(1-\gamma)\cdot\dot{x}_k)$$

Here, T is the calculation step size and by choosing a value for $\gamma$, the respective discretization method can be configured (for $\gamma=0$, $\gamma=\frac{1}{2}$ and $\gamma=1$ forward Euler, Tustin and backward Euler).

If the previously described discretization is applied to the ratios of current and voltage at the switch coil 7, it follows (equation 2) that:

$$
\begin{aligned}
\dot{i}_L &- L^{-1}v_L \\
&\Rightarrow i_{L,k+1} = i_{L,k} + T\left(\gamma \dot{i}_{L,k+1} + (1-\gamma)\dot{i}_{L,k}\right) \\
&= i_{L,k} + T\left(\gamma L^{-1} v_{L,k+1} + (1-\gamma)L^{-1}v_{L,k}\right) \\
&= \underbrace{\frac{\gamma T}{L}}_{G_L} v_{L,k+1} + \underbrace{i_{L,k} + \underbrace{\frac{T(1-\gamma)}{L}}_{=\frac{T}{L}(1-\gamma)\frac{\gamma}{\gamma}=\frac{T\gamma}{L}\frac{1-\gamma}{\gamma}=G_L\frac{1-\gamma}{\gamma}}}_{I_{L,k+1}} v_{L,k}
\end{aligned}
$$

$$\frac{d}{dt}i_L = \frac{1}{L}v_L \Rightarrow i_{L,k+1} = G_L v_{L,k+1} + I_{L,k+1}$$

The following applies for I$_{L,k+1}$ and for G$_L$:

$$I_{L,k+1} = \frac{1-\gamma}{\gamma}G_L v_{L,k} + i_{L,k}, \ G_L = \frac{\gamma T}{L}, \gamma \neq 0$$

Following the same principle, the corresponding relationships between the current through the switch capacitor 8 and the voltage at the switch capacitor 8 can be described by equation 3, the derivation being analogous (equation 3):

$$\frac{d}{dt}v_C = \frac{1}{C}i_C \Rightarrow i_{C,k+1} = G_C v_{C,k+1} + I_{C,k+1}$$

The following applies for I$_{C,k+1}$ and for G$_C$ in equation 3 (equation 3a):

$$I_{C,k+1} = -G_C v_{C,k} - \frac{1-\gamma}{\gamma}i_{C,k}, \ G_C = \frac{C}{\gamma T}, \gamma \neq 0$$

It can be seen that the mathematical structures for the current through the switch coil 7 and the current through the switch capacitor 8 are structurally identical for the case that the conductance components $G_L$ and $G_C$ appearing in the equations are chosen to be the same. Thus, structurally identical, time-discrete switch equations $i_{S,k}$ can actually be found in the event that the conductance components $G_L$ and $G_C$ are selected to be identical, that is, chosen to be a uniform conductance component $G_S$. On this basis, the following applies (equation 4):

$$G_s = \frac{\gamma T}{L_s} = \frac{C_s}{\gamma T}$$

This means that $i_{S,k}$ or $i_{S,k+1}$ (equation 5) applies to the structurally identical, time-discrete switch equations:

$$i_{S,k+1} = G_S v_{S,k+1} + I_{S,k+1}$$

In the case of the time-discrete equations specified, the index for the calculation step can of course also be shifted, so that equation 5 specified for the calculation step k+1 is also simply shifted to calculation step k, in that the calculation step k+1 is replaced everywhere by the calculation step k, which is the same in terms of content.

As previously derived, an embodiment of the method 1 is thus characterized in that the structurally identical, time-discrete switch equations $i_{S,k}$ for the switch elements $T_i$ have a uniform conductance component $G_S$ for the conductive and the blocking switched states of the respective switch element $T_i$, and the power source components $I_{S,k}$ are additional inputs of the switched state-independent, time-discrete state space representation H, $\phi$, $C_d$, $D_d$, so that different total switched states $SST_i$ are set only by influencing the additional inputs, i.e. the power source components $I_{S,k}$.

In FIG. 2, these power source components $I_{S,k}$ are designated with $I_{SW,k}$, the reason being an improved embodiment of the method 1, which subsequently will become evident. The signal flow diagram of the switched state-independent, time-discrete state space representation H, $\phi$, $C_d$, $D_d$ in FIG. 2 in any case demonstrates that the switched states of the switch elements $T_i$ are exclusively influenced by additional inputs on the far left at the input node of the state space representation (see also the input vector g development of the switch elements in the feedback path). The turning on and off of the switch elements $T_i$ is therefore done by the appropriate choice of the power source components $I_{S,k}$. Equation 6 specifies the corresponding values for a blocking switch element $T_i$ (off) and for a conductive switch element $T_i$ (on):

$$I_{S,k+1} = \begin{cases} -G_S/\gamma v_{S,k} - (1-\gamma)/\gamma I_{S,k} & \text{off} \\ G_S/\gamma v_{S,k} + I_{S,k} & \text{on} \end{cases}$$

From equation 6 it can be seen that the value for the power source components $I_{S,k+1}$ in the conductive switched state of the switch elements $T_i$ and in the blocking switched state of the switch elements $T_i$ at the calculation time k+1 depends on the value of the power source components $I_{S,k}$ at the calculation time k. The derivation of the relationship in equation 6 can be shown, for example, for the blocking state off as follows, based on equation 3a:

$$I_{S,k+1} = -G_S v_{S,k} - \frac{1-\gamma}{\gamma} i_{S,k}$$

-continued $$= -G_S v_{S,k} - \frac{1-\gamma}{\gamma}(G_S v_{S,k} + I_{S,k})$$

$$= -G_S v_{S,k} - \frac{1-\gamma}{\gamma} G_S v_{S,k} - \frac{1-\gamma}{\gamma} I_{S,k}$$

$$= -\gamma^{-1} G_S v_{S,k} - \gamma^{-1}(1-\gamma) I_{S,k}$$

The derivation is analogous for the conductive state on of a switch element $T_i$, based on the time-discrete current equation for the switch coil.

Equations 5 and 6 can be combined to the following equation 6a by introducing the switched state variable $s_i$, which is equal to 1 in the conductive state and 0 in the blocking state:

$$I_{S,k+1} = -\frac{1-\gamma-s_i}{\gamma} I_{S,k} - \frac{1-2s_i}{\gamma} G_S v_{S,k}$$

Replacing each of the switch elements $T_i$ with one arrangement with energy stores, namely in each case with a switch capacitor 8 and a switch coil 7, results in transient processes in the simulation of circuit 2 which are inherently connected therewith, so that a certain amount of time passes until the stationary states set in, which are actually desired for a conductive or a blocking switch element $T_i$. A further development of the method 1, therefore, is characterized in that in order to shorten transient transitions during switchover of the switched state of the switch elements $T_i$, the power source components $I_{S,k}$ exhibit an additional pulse current $\tilde{I}_{FF}$, thereby realizing a feed-forward control. Preferably, the additional pulse current $\tilde{I}_{FF}$ is unequal to zero in only one calculation step; it preferably only acts at the time of the switchover of the respective switch element $T_i$.

Figures 3A, 3B, 3C:
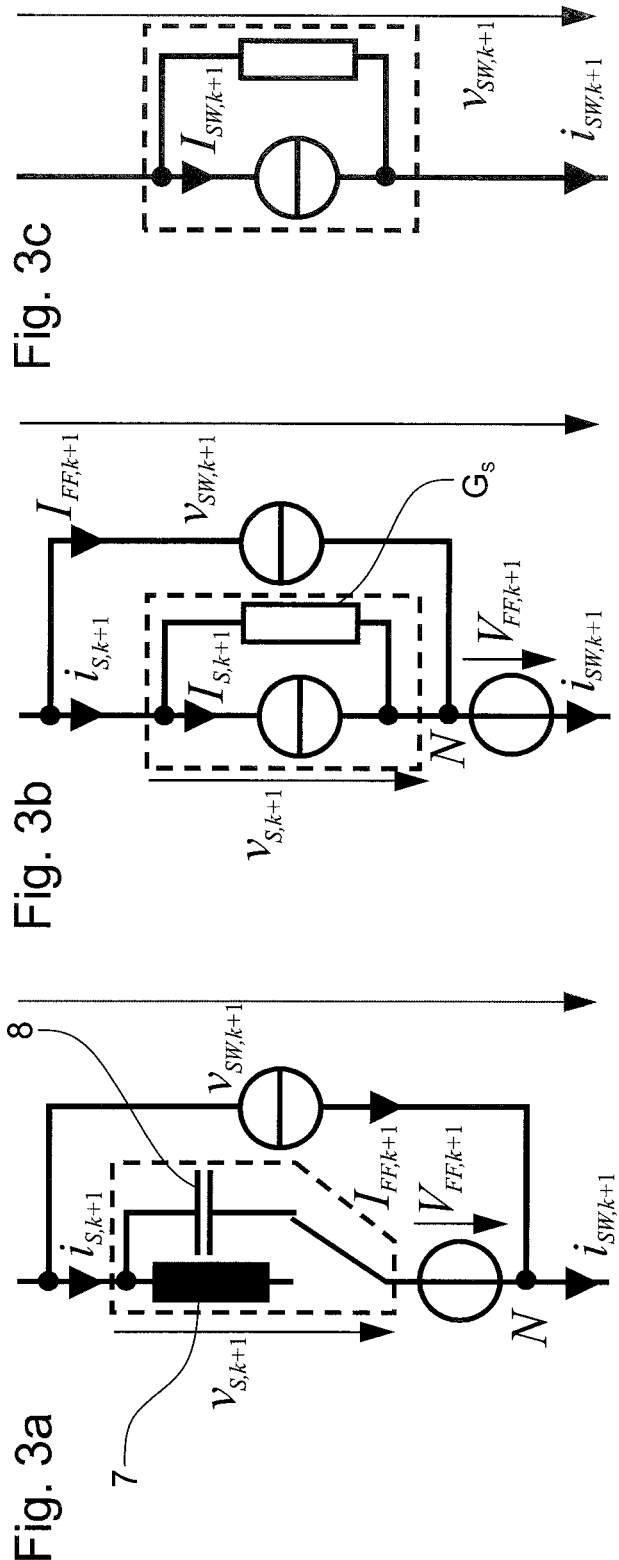
FIGS. 3a to 3c show L/C equivalent circuits diagrams for switch elements and the addition of feed-forward control sources to implement a feed-forward control for the purpose of reducing transient processes.

FIG. 3 shows how the switch-equivalent circuit for a switch element $T_i$ with a switch coil 7 and with a switch capacitor 8 can be further developed in order to implement the previously described feed-forward control with the additional pulse current $\tilde{I}_{FF}$. In FIG. 3a, the equivalent circuit diagram described above for a switch element $T_i$ with the switch coil 7 and the switch capacitor 8 is supplemented with additional feed-forward control sources, namely with the feed-forward control power source $I_{FF,k+1}$ connected in parallel and with the series-connected feed-forward control voltage source $V_{FF,\ k+1}$. From FIG. 3a to FIG. 3b, the L/C equivalent circuit diagram for the switch element $T_i$ has then been replaced by the equivalent circuit with the uniform conductance component $G_S$ and the power source component $I_{S,k+1}$. Furthermore, the node N has been placed in front of the feed-forward control voltage source $V_{FF,k+1}$, which is easily possible since one of the feed-forward control sources, i.e. either the feed-forward control voltage source $V_{FF,k+1}$ or the feed-forward control voltage source $I_{FF,k+1}$, is 0 in each switched state. A further combination of the circuit components has taken place from FIG. 3b to FIG. 3c. Starting from FIG. 3b, the following applies to the node currents in node N (equation 7):

$$i_{SW,k+1} = G_S v_{S,k+1} + I_{S,k+1} + I_{FF,k+1}$$

$$= G_S(v_{SW,k+1} - V_{FF,k+1}) + I_{S,k+1} + I_{FF,k+1}$$

This equation can be transposed according to the following equation, which describes the circuit in FIG. 3c (equation 8).

$$i_{SW,k+1} = G_S v_{SW,k+1} + I_{SW,k+1}$$

$$I_{SW,k+1} = I_{S,k+1} + I_{FF,k+1} - G_S V_{FF,k+1}$$

Equation 8 above has the same structure as equation 5. When $I_{S,k+1}$ of equation 6a is inserted in the lower equation 8, the following applies by using the relationship $v_{S,k+1} = v_{SW,k+1} - V_{FF,k+1}$ of FIG. 3b (equation 9):

$$I_{SW,k+1} = -\frac{1-\gamma-s_i}{\gamma} I_{SW,k} - \frac{1-2s_i}{\gamma} G_S v_{SW,k} + \tilde{I}_{FF,k+1}$$

wherein for the pulse current $\tilde{I}_{FF}$, the following applies (equation 10):

$$I_{FF,k+1} = \begin{cases} -G_S(V_{FF,k+1} - V_{FF,k}) & , \text{off} \\ I_{FF,k+1} - I_{FF,k} & , \text{on} \end{cases}$$

The result in equation 10 follows from equation 9 with the following mathematical considerations:

$$I_{sw,k+1} =$$

$$I_{S,k+1} + I_{FF,k+1} - G_S V_{FF,k+1} = -\frac{1-\gamma-s_i}{\gamma} \underbrace{I_{S,k}}_{I_{sw,k}-I_{FF,k}+G_S V_{FF,k}} - \frac{1-2s_i}{\gamma} G_S \underbrace{v_{s,k}}_{v_{sw,k}-V_{FF,k}} + \underbrace{I_{FF,k+1} - G_S V_{FF,k+1}}_{I_{s,k+1}} =$$

$$-\frac{1-\gamma-s_i}{\gamma}(I_{sw,k} - I_{FF,k} + G_s V_{FF,k}) - \frac{1-2s_i}{\gamma} G_s v_{sw,k} + \frac{1-2s_i}{\gamma} G_S V_{FF,k} + I_{FF,k+1} - G_S V_{FF,k+1} =$$

$$-\frac{1-\gamma-s_i}{\gamma} I_{sw,k} - \frac{1-2s_i}{\gamma} G_S v_{sw,k} + \underbrace{\frac{1-\gamma-s_i}{\gamma} I_{FF,k} - \frac{1-\gamma-s_i}{\gamma} V_{FF,k} + \frac{1-2s_i}{\gamma} G_S V_{FF,k} + I_{FF,k+1} - G_S V_{FF,k+1}}_{=:\tilde{I}_{FF_{k+1}}}$$

$$\tilde{I}_{FF_{k+1}} = \begin{cases} G_S(V_{FF,k} - V_{FF,k+1}) & \text{for } s_i = 0 \text{(off)} \Rightarrow I_{FF,k} = I_{FF,k+1} = 0 \\ I_{FF,k+1} - I_{FF,k} & \text{for } s_i = 1 \text{(on)} \Rightarrow V_{FF,k} = V_{FF,k+1} = 0 \end{cases}$$

If the switched state of a switch element $T_i$ is changed, $I_{SW,k}$ is set to zero and the pulse current $\tilde{I}_{FF}$ is activated for the duration of a simulation step. The pulse required for the feed-forward control is caused by the different pulse strengths according to equation 10.

The amount of the pulse current $\tilde{I}_{FF}$ for a switch element $T_i$ is calculated with the proviso that the transient transition in the change of the switched state of the switch element $T_i$ is completely avoided. Preferably, the power source components $I_{S,k}$ of those switch elements $T_i$ that appear "important", in the present case these are the switch elements $T_i$ with the highest actual or expected switching frequency, are equipped with the additional pulse current.

FIG. 2 shows the switched state-independent, time-discrete state space representation H, $\phi$, $C_d$, $D_d$. It is possible to directly derive this switched state-independent, time-discrete state space representation H, $\phi$, $C_d$, $D_d$, starting from the circuit 2 and using the equivalent circuit for switch elements $T_i$ with switch coil 7 and switch capacitor 8, and with a discretization approach, for example the discretization approach according to equation 1. It may be easier to understand by initially starting with a continuous-time state space representation having the usual system matrices A, B, C, D.

As has already been shown in detail above, switch elements $T_i$ are replaced by an equivalent circuit with switch coils 7 and switch capacitors 8 and the continuous-time state space representation is transferred into the switched state-independent, time-discrete state space representation H, $\phi$, $C_d$, $D_d$ using a discretization approach. The sole use of the equivalent circuit for the switch elements $T_i$ according to FIG. 3c leads to the following continuous-time and switched state-independent state space representation (equation 11, here superscript T means "transposed"):

$$\dot{x} = Ax + Bu, \quad y = Cx + Du$$

$$u = [I_{SW}^T | u_L^T]^T, \quad y = [v_{SW}^T | i_{SW}^T \quad y_L^T]^T$$

$I_{SW}$ contains all currents of the power source components of the L/C equivalent circuit diagram for the switch elements $T_i$ and $u_L$ represents all other sources in the circuit 2 modified by the L/C equivalent circuit diagram for the switch elements $T_i$. $V_{SW}$ includes all switch element voltages and $i_{SW}$ includes all switch element currents. The output vector $y_L$ contains all other variables which are of interest in the circuit 2 with regard to the simulation. The output variables in $i_{SW}$ are used to evaluate all switch element currents and switch element voltages in the "switch logic".

The discretization of the continuous-time and switched state-independent state space representation according to equation 11, using the discretization approach according to equation 1, leads to the following relationship, namely the switched state-independent, time-discrete state space representation H, $\phi$, $C_d$, $D_d$ according to equation 12 (here, T is the calculation step size from the discretization approach):

$$\Phi = (E - \gamma TA)^{-1}(E + (1-\gamma) \cdot TA),$$

$$H = (\Phi \cdot (E - \gamma TA)^{-1}\gamma + (E - \gamma TA)^{-1}(1-\gamma))TB,$$

$$C_d = C, D_d = (E - \gamma TA)^{-1}\gamma TB + D.$$

Here, the relationships according to equation 13 also apply:

$$u_k = [I_{SW,k}^T | u_{L,k}^T]^T,$$

$$y_k = [v_{SW,k}^T | i_{SW,k}^T \quad y_{L,k}^T]^T$$

H, $\phi$, $C_d$, $D_d$ are the time-discrete system, input, output and transmission matrices. The interaction of all variables in terms of signal flow is shown graphically in the computing unit 3 in FIG. 2. In order to make it clear that the time-discrete calculation of the variables involved is done by explicit equations in the respective variables, i.e. no algebraic loops have to be resolved by implicit calculation methods, dead time elements 9 have been symbolically inserted in the state space representation in FIG. 2 which are brought about by the numerical calculation itself.

Figure 4:
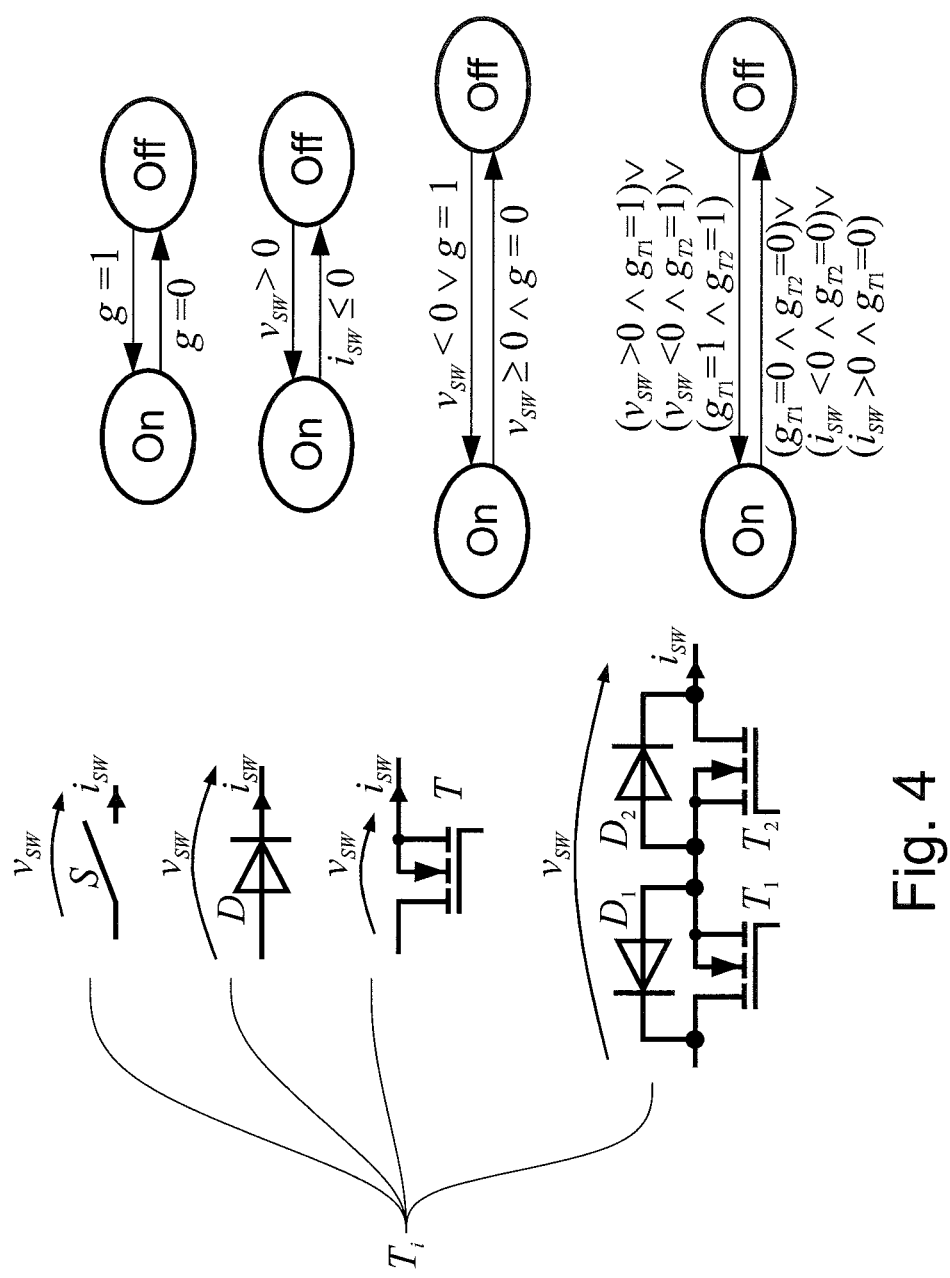
FIG. 4 shows the switch logic of various semiconductor switch elements.

How the "switch logic" works is exemplified in FIG. 4 using various switch elements $T_i$. For the state transitions on/off, the signals at the control inputs g of the switch elements $T_i$ must be taken into account, as well as the existing currents in the respective switch element $T_i$. The relationships shown in FIG. 4 are readily apparent and do not need to be explained in detail.

It has been described above that the structurally identical, time-discrete switch equations $i_{S,k}$ (or $i_{SW,k}$, if the feed-forward control is taken into account) for the switch elements $T_i$ have a uniform conductance component $G_S$ for the conductive and the blocking switched states of the respective switch elements $T_i$ and a power source component $I_{S,k}$ (or $I_{SW,k}$, if the feed-forward control is taken into account). The question arises as to how the uniform conductance components $G_S$ should be specifically selected in the structurally identical, time-discrete switch equations $i_{S,k}$ for the switch elements $T_i$. The boundary condition from equation 4 shows that a desirable small value for the capacitance of the switch capacitor 8 contradicts an equally desirable small value for the inductance of the switch coil 7.

For the purpose of determining an optimized uniform conductance component $G_S$, the method 1 is designed such that from the switched state-dependent, time-discrete state space representation H, $\phi$, $C_d$, $D_d$, when using the concrete choice for the conductance components $G_S$ and the power source components $I_{S,k}$ and possibly the pulse currents $\tilde{I}_{FF}$, a concrete, extended time-discrete state space representation with a system matrix $\phi^*$ is obtained and the eigenvalues A are calculated as a stability parameter from the system matrix $\phi^*$. Since the eigenvalues A make a decisive statement about the dynamic behavior of the time-discrete overall system, their values are suitable as an evaluation measure for the stability and the dynamic behavior of the circuit 2. The system matrix $\phi^*$ can be obtained from equation 9 if this is formulated as a vector equation, as shown in equation 14:

$$I_{SW,k+1} = M_I \cdot I_{SW,k} + M_v \cdot v_{SW,k} + \tilde{I}_{FF,k+1}$$

The relationships according to equation 15 apply here:

$$M_1 = -\frac{1}{\gamma}(E(1-\gamma)-S), \; M_v = \frac{1}{\gamma}(2S-E)G,$$

$$S = \mathrm{diag}(s_1 \ldots s_{n_{SW}}), \; F = \mathrm{diag}(G_{S1} \ldots D_{Sn_{SW}}).$$

The diagonal matrix S contains all switched states $s_i$ of each switch element $T_i$. The diagonal matrix G contains all uniform conductance components $G_{Si}$ for each individual switch element $T_i$. Thus, it is possible for each switch element $T_i$ to choose an individual uniform conductance component $G_{Si}$, which, for example, is different from all other uniform conductance components $G_{Si}$ of the other switch elements $T_i$; likewise, identical values for the uniform conductance components $G_{Si}$ can also be chosen for all switch elements $T_i$. In similar switch elements $T_i$, it may be more plausible to select identical values for the uniform conductance components $G_{Si}$, particularly if they are components in a common assembly, such as a bridge circuit. In the case of different types of switch elements $T_i$ (or also in the case of the same type of switch elements $T_i$, if these are installed in different assemblies or are wired differently externally) it could be useful to choose values that differ from one another for the uniform conductance components $G_{Si}$. If instead of the designation $x_k$ for the state variable, the term $w_k$ is used in order to identify the transformation by the discretization of the state variables described in equation 12, the following equation 16 follows from equation 12

$$w_{k+1} = \Phi w_k + \underbrace{\begin{bmatrix} H_1 & H_2 \end{bmatrix}}_{H} \cdot \underbrace{\begin{bmatrix} I_{SW,k} \\ u_{L,k} \end{bmatrix}}_{u_k}$$

and also equation 17

$$\underbrace{\begin{bmatrix} v_{SW,k} \\ i_{SW,k} \\ y_{L,k} \end{bmatrix}}_{y_k} = \underbrace{\begin{bmatrix} C_{d1} \\ C_{d2} \end{bmatrix}}_{C_d} w_k + \underbrace{\begin{bmatrix} D_{d11} & D_{d12} \\ D_{d21} & D_{d22} \end{bmatrix}}_{D_d} \cdot \underbrace{\begin{bmatrix} I_{SW,k} \\ u_{L,k} \end{bmatrix}}_{u_k}$$

From this, a general state space representation including the calculation of the power source components $I_{SW,k}$ can be derived (equation 18):

$$\begin{bmatrix} w_{k+1} \\ I_{SW,k+1} \end{bmatrix} = \Phi^* \begin{bmatrix} w_k \\ I_{SW,k} \end{bmatrix} + \begin{bmatrix} H_2 & 0 \\ M_v D_{d12} & E \end{bmatrix} \begin{bmatrix} u_{L,k} \\ \tilde{I}_{FF,k+1} \end{bmatrix},$$

$$\begin{bmatrix} v_{SW,k} \\ i_{SW,k} \\ y_{L,k} \end{bmatrix} = \begin{bmatrix} C_{d1} & D_{d11} \\ C_{d2} & D_{d21} \end{bmatrix} \begin{bmatrix} w_k \\ I_{SW,k} \end{bmatrix} + \begin{bmatrix} D_{d12} & 0 \\ D_{d22} & 0 \end{bmatrix} \begin{bmatrix} u_{L,k} \\ \tilde{I}_{FF,k+1} \end{bmatrix}$$

In this case, the following applies (equation 19):

$$\Phi^* = \Phi^*(G, S) = \begin{bmatrix} \Phi & H_1 \\ M_v C_{d1} & M_1 + M_v D_{d11} \end{bmatrix}.$$

From this comprehensive extended system matrix $\phi^*$, the eigenvalues $\lambda_i$ can be calculated in a known manner. By varying the values for the conductance components $G_S$, different eigenvalue configurations are obtained, which must be subjected to a corresponding evaluation. The eigenvalue configuration appearing to be most suitable as a result of these reviews allows for a conclusion to be drawn as to which choice is best for the values of the conductance components $G_S$.

In an advantageous development of the method, it is provided that desired reference eigenvalues $\lambda_{Refi}$ are specified and that via the calculation of a quality criterion J using the eigenvalues $\lambda_i$ of the system matrix $\phi^*$ of the extended time-discrete state space representation and the reference eigenvalues $\lambda_{Refi}$, the best choice is determined for the uniform conductance component $G_S$ for the conductive and the blocking switched states of the respective switch element $T_i$.

The reference eigenvalues $\lambda_{Refi}$ are preferably specified in such a way that a switched state-dependent, time-discrete state space representation is determined as the reference circuit for each total switched state $SST_i$ of the circuit 2 by using the smallest possible values for the inductances of the switch coils 7 and the capacitances of the switch capacitors 8, which is only possible under the condition that a uniform conductance component $G_S$ is used for the switch elements $T_i$ for the conductive and the blocking switched states of the respective switch element $T_i$ (equation 4). From the system matrix of the switched state-dependent, time-discrete state space representation of the reference circuit, the reference eigenvalues $\lambda_{Refi}$ (herein, the index i to the respective eigenvalue) are calculated for each total switched state $SST_i$ (here, the index i describes the respective total switched state) of the circuit 2. By calculating a quality criterion J, using the eigenvalues $\lambda_i$ of the system matrix t of the expanded time-discrete state space representation and the reference eigenvalues $\lambda_{Refi}$, the best choice for the uniform conductance component $G_S$ is determined for the conductive and the blocking switched states of the respective switch element $T_i$.

The quality criterion J can, for example, be determined according to the following calculation rule (equation 20), with the index j running through all the total switched states $SST_j$ and the index i running through all eigenvalues in the respective total switched state:

$$J = \sum_{j=1}^{2^{nSW}} \sum_{i=1}^{n_\lambda} \left| \frac{\lambda_{i,j} - \lambda_{Refi,j}}{\lambda_{Refi,j}} \right|, \ \lambda_{Refi,j} \neq 0$$

This quality criterion J is a summary measure for a dynamic deviation, which is calculated from the sum of the differences between the eigenvalues A of the system matrix of the extended time-discrete state space representation and the corresponding reference eigenvalues $\lambda_{Refi}$ of the system matrix of the switched state-dependent time-discrete state space representation of the overall reference circuit. In order to obtain the greatest possible approximation of the eigenvalues $\lambda_i$ of the system matrix of the extended time-discrete state space representation and the corresponding reference eigenvalues $\lambda_{Refi}$ of the system matrix of the switched state-dependent, time-discrete state space representation, J is minimized as a measure for the dynamic deviation. In the above example, the various switched states of the expanded time-discrete state space representation of the reference circuit are also added up.

Figure 5:
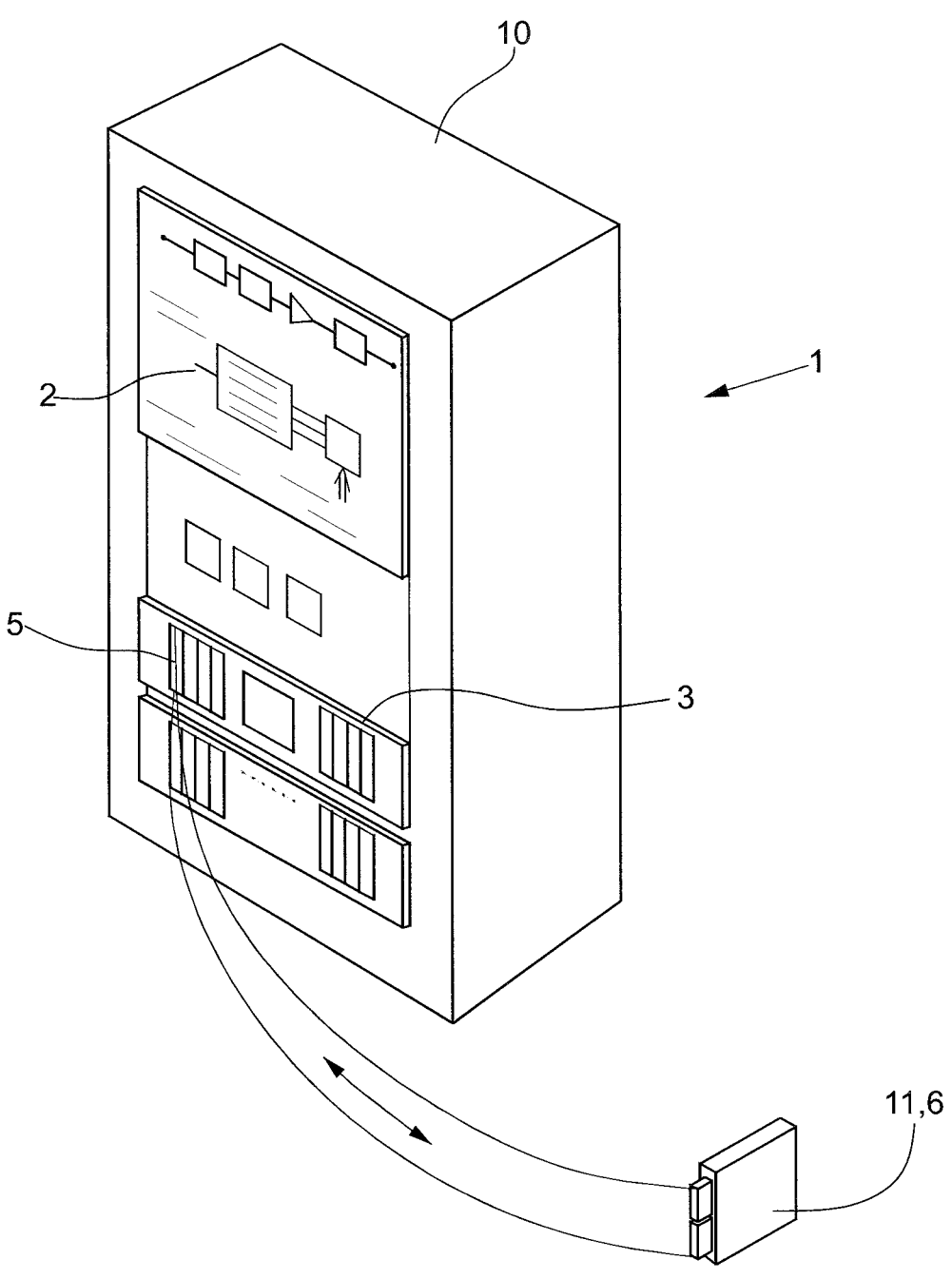
FIG. 5 shows a simulator on which the method for simulating an electrical circuit is executed.

Finally, FIG. 5 shows a simulator 10, here an HIL simulator with a computing unit 3 for simulating an electrical circuit 2, wherein the computing unit 3 is programmed with a program in such a way that the method 1 described above is carried out with the computing unit 3. The simulator 10 is connected to a control device 11, which is the physical process 6 here, via the I/O interface 5.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A computer-implemented method for simulating an electrical circuit via at least one computing unit, the method comprising:

providing the electrical circuit with circuit components with switch elements capable of assuming either a conductive or a blocking switched state;

describing the circuit using a mathematical representation and the circuit for each total switched state being calculated on the computing unit by numerically solving the mathematical representation which describes the total switched state;

representing a conductive switch element in the circuit by a switch coil;

representing a blocking switch element in the circuit by a switch capacitor;

describing the electrical behavior of switch coil and switch capacitor by structurally identical, time-discrete switch equations so that using the structurally identical time-discrete switch equations for the switch elements results in a switched state-independent, time-discrete state space representation H, $\phi$, $C_d$, $D_d$ for all total switched states of the circuit, where H is a time-discrete system matrix, $\phi$ is an input matrix, $C_d$ is an output matrix, $D_d$ is a transmission matrix;

performing the simulation on the computing unit based on the switched state-independent, time-discrete state space representation H, $\phi$, $C_d$, $D_d$ for all total switched states of the circuit; and outputting selected calculated output variables of the electrical circuit as electrical signals to act on a technical-physical process, wherein the structurally identical, time-discrete switch equations for the switch elements comprise a power source component $I_{S,k}$, and wherein for shortening transient transitions when changing the switched state of the switch elements, the power source components $I_{S,k}$ have an additional pulse current $\tilde{I}_{FF}$, thus realizing a feed-forward control.

2. The method according to claim 1, wherein the structurally identical, time-discrete switch equations for the switch elements further comprise a uniform conductance component for the conductive and the blocking switched states of the respective switch element, and wherein the power source components $I_{S,k}$ are additional inputs of the switched state-independent, time-discrete state space representation H, $\phi$, $C_d$, $D_d$, so that different total switched states are only set by influencing the additional inputs or the power source components.

3. The method according to claim 2, wherein the pulse current $\tilde{I}_{FF}$ is equal to zero in only one calculation step, preferably only at the time of switchover of the respective switch element.

4. The method according to claim 3, wherein the level of the pulse current $\tilde{I}_{FF}$ for a switch element is calculated with the proviso that the transient transition is completely avoided when changing the switched state of the switch element.

5. The method according to claim 3, wherein the power source components $I_{S,k}$ of those switch elements that have the highest actual or expected switching frequency are equipped with the additional pulse current $\tilde{I}_{FF}$.

6. The method according to claim 2, wherein a specific extended time-discrete state space representation with a system matrix $\phi^*$ is obtained from the switched state-independent, time-discrete state space representation of H, $\phi$, $C_d$, $D_d$ by using the specific choice for the conductance components $G_S$ and the power source components $I_{S,k}$ and possibly for the pulse currents $\tilde{I}_{FF}$, and that the eigenvalues $\lambda_i$ are calculated as a stability parameter from the system matrix $\phi^*$.

7. The method according to claim 6, wherein, as a reference circuit for each total switched state of the circuit, a switched state-dependent, time-discrete state space representation is determined by assuming the smallest possible values for the inductances of the switch coils and for the capacitances of the switch capacitors, in particular subject to the condition that a uniform conductance component $G_S$ is used for the conductive and the blocking switched states of the respective switch element, and wherein from the system matrix of the switched state-dependent, time-discrete state space representation of the reference circuit, the reference eigenvalues $\Delta_{Refi}$ are calculated for each switched state of the circuit, and wherein, via the calculation of a quality criterion using the eigenvalues $\lambda_i$ of the system matrix of the extended time-discrete state space representation and the reference eigenvalues $\Delta_{Refi}$, the best choice for the uniform conductance component $G_S$ is determined for the conductive and the blocking switched states of the respective switch elements.

8. The method according to claim 7, wherein a summary measure for a dynamic deviation is calculated as the quality criterion J from the sum of the differences between the eigenvalues $\lambda_i$ of the extended time-discrete state space representation and the corresponding reference eigenvalues $\Delta_{Refi}$ of the switched state-dependent, time-discrete state space representation of the overall reference circuit, and that the summary stability parameter is minimized, in particular wherein in addition, the switched state-dependent, time-discrete state space representation of the reference circuit is added up over the various switched states.

9. The method according to claim 2, wherein the pulse current $\tilde{I}_{FF}$ is equal to zero in only one calculation step.

10. The method according to claim 2, wherein the pulse current $\tilde{I}_{FF}$ is equal to zero only at the time of switchover of the respective switch element.

11. The method according to claim 1, wherein the value for the power source components $I_{S,k+1}$ in the conductive switched state of the switch elements and in the blocking switched state of the switch elements at the calculation time k+1 at least depends on the value of the power source components $I_{S,k}$ at calculation time k.

12. A simulator with a computing unit for the simulation of an electric circuit, wherein the computing unit is programmed with a program such that when executing the program, the method according to claim 1 is performed.

13. A non-transitory, computer-readable storage medium storing a computer program, comprising commands that, when executing the program via a computing unit, cause the computing unit to carry out the method according to claim 1.

14. The method according to claim 1, wherein the technical-physical process is a control device for an automobile, an aircraft or an energy generation and energy distribution systems.

15. The method according to claim 1, wherein the technical-physical process is a frequency converter of an electric drive controlled by the simulated electrical circuit, a DC/DC converter controlled by the simulated electrical circuit, a power supply network controlled by the simulated electrical circuit, or a machine part controlled by the simulated electrical circuit.

16. The method according to claim 1, wherein the at least one computing units is used for hardware-in-the-loop (HIL) simulation or Rapid Control Prototyping (RCP).

17. The method according to claim 1, wherein the selected calculated output variables of the electrical circuit are out as electrical signals by an I/O interface.

18. A method for controlling a physical-technical process, comprising:

simulating an electrical circuit, said simulating comprising:
  providing the electrical circuit with circuit components with switch elements capable of assuming either a conductive or a blocking switched state;
  describing the circuit using a mathematical representation and the circuit for each total switched state being calculated on a computing unit by numerically solving the mathematical representation which describes the total switched state;
  representing a conductive switch element in the circuit by a switch coil;
  representing a blocking switch element in the circuit by a switch capacitor;
  describing the electrical behavior of switch coil and switch capacitor by structurally identical, time-discrete switch equations so that using the structurally identical time-discrete switch equations for the switch elements results in a switched state-independent, time-discrete state space representation H, $\phi$, $C_d$, $D_d$ for all total switched states of the circuit, where H is a time-discrete system matrix, $\phi$ is an input matrix, $C_d$ is an output matrix, $D_d$ is a transmission matrix; and
  performing the simulation on the computing unit based on the switched state-independent, time-discrete state space representation H, $\phi$, $C_d$, $D_d$ for all total switched states of the circuit; and
outputting selected calculated output variables of the electrical circuit as electrical signals to act on a technical-physical process,
wherein the structurally identical, time-discrete switch equations for the switch elements comprise a power source component $I_{S,k}$, and
wherein for shortening transient transitions when changing the switched state of the switch elements, the power source components $I_{S,k}$ have an additional pulse current $\tilde{I}_{FF}$, thus realizing a feed-forward control.

19. A system, comprising:

an electrical circuit;

a technical-physical process; and a computing unit configured to directly interact with the physical technical process and to simulate the electrical circuit, the computing unit comprises an I/O interface configured to act on the technical-physical process, the computing unit being configured to simulate the electrical circuit by:

providing the electrical circuit with circuit components with switch elements capable of assuming either a conductive or a blocking switched state;

describing the circuit using a mathematical representation and the circuit for each total switched state being calculated on the computing unit by numerically solving the mathematical representation which describes the total switched state;

representing a conductive switch element in the circuit by a switch coil;

representing a blocking switch element in the circuit by a switch capacitor;

describing the electrical behavior of switch coil and switch capacitor by structurally identical, time-discrete switch equations so that using the structurally identical time-discrete switch equations for the switch elements results in a switched state-independent, time-discrete state space representation H, $\phi$, $C_d$, $D_d$ for all total switched states of the circuit, where H is a time-discrete system matrix, $\phi$ is an input matrix, $C_d$ is an output matrix, $D_d$ is a transmission matrix;

performing the simulation on the computing unit based on the switched state-independent, time-discrete state space representation H, $\phi$, $C_d$, $D_d$ for all total switched states of the circuit; and

outputting selected calculated output variables of the electrical circuit as electrical signals to act on the technical-physical process, wherein the structurally identical, time-discrete switch equations for the switch elements comprise a power source component $I_{S,k}$, and wherein for shortening transient transitions when changing the switched state of the switch elements, the power source components $I_{S,k}$ have an additional pulse current $\tilde{I}_{FF}$, thus realizing a feed-forward control.

\* \* \* \* \*